(12) United States Patent
Chiu et al.

(10) Patent No.: US 11,127,707 B2
(45) Date of Patent: Sep. 21, 2021

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Chi-Tsung Chiu, Kaohsiung (TW); Hui-Ying Hsieh, Kaohsiung (TW); Hui Hua Lee, Kaohsiung (TW); Cheng Yuan Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/512,132

(22) Filed: Jul. 15, 2019

(65) Prior Publication Data

US 2021/0020594 A1  Jan. 21, 2021

(51) Int. Cl.
*H01L 23/00* (2006.01)
*H01L 23/31* (2006.01)
*H01L 23/13* (2006.01)
*H01L 21/56* (2006.01)

(52) U.S. Cl.
CPC ............ *H01L 24/20* (2013.01); *H01L 21/561* (2013.01); *H01L 23/13* (2013.01); *H01L 23/3121* (2013.01); *H01L 23/3135* (2013.01); *H01L 24/19* (2013.01); *H01L 24/97* (2013.01); *H01L 24/32* (2013.01); *H01L 24/73* (2013.01); *H01L 2224/32225* (2013.01); *H01L 2224/32245* (2013.01); *H01L 2224/73151* (2013.01)

(58) Field of Classification Search
CPC ... H01L 21/561; H01L 23/13; H01L 23/3121; H01L 23/3135; H01L 24/19; H01L 24/20; H01L 24/97
See application file for complete search history.

(56) References Cited

U.S. PATENT DOCUMENTS

| 5,471,368 | A | 11/1995 | Downie et al. |
| 2010/0102453 | A1* | 4/2010 | Tseng ............ H01L 23/481 257/774 |
| 2016/0141213 | A1* | 5/2016 | Bishop ............ H01L 24/73 438/16 |
| 2018/0151478 | A1* | 5/2018 | Chen ............ H01L 24/73 |

FOREIGN PATENT DOCUMENTS

JP    2005-166931 A    6/2005

* cited by examiner

*Primary Examiner* — Allan R Wilson
(74) *Attorney, Agent, or Firm* — Foley & Lardner LLP

(57) ABSTRACT

A semiconductor package structure includes a base material, at least one semiconductor chip, an encapsulant, a depression structure, a redistribution layer and at least one conductive via. The semiconductor chip is disposed on the base material. The encapsulant is disposed on the base material and covers the at least one semiconductor chip. The encapsulant has an outer side surface. The depression structure is disposed adjacent to and exposed from of the outer side surface the encapsulant. The redistribution layer is disposed on the encapsulant. The conductive via is disposed in the encapsulant and electrically connects the semiconductor chip and the redistribution layer.

20 Claims, 18 Drawing Sheets

SEMICONDUCTOR PACKAGE STRUCTURE AND METHOD FOR MANUFACTURING THE SAME

BACKGROUND

1. Field of the Disclosure

The present disclosure relates to a semiconductor package structure and a manufacturing method, and to a semiconductor package structure including a wettable flank, and a method for manufacturing the same.

2. Description of the Related Art

Semiconductor package structures have been used in the auto-vehicle (ATV) field. The semiconductor package structure historically has lateral side surfaces from which sawn circuit layer is exposed. During assembly to the motherboard, solder wicks up the sidewalls of the circuit layer and forms a solder fillet which can be inspected for joint quality. That is, the side surfaces of the semiconductor package structure are solder wettable flanks that can be used for inspection to insure the joint quality between the semiconductor package structures and the motherboard. However, most of the lateral side surface is the molding compound which prevents the solder from wetting onto the lateral side surfaces of the semiconductor package structure. In addition, after a saw singulation process of the semiconductor package structure, the circuit layer exposed on the lateral side surfaces of the semiconductor package structure may be oxidized readily. Such oxide portion of the circuit layer may further prevent the solder from wetting onto the lateral side surfaces of the semiconductor package structure.

SUMMARY

In some embodiments, a semiconductor package structure includes a base material, at least one semiconductor chip, an encapsulant, a redistribution layer, a wetting layer and at least one conductive via. The semiconductor chip is disposed on the base material. The encapsulant is disposed on the base material and covers the semiconductor chip. The redistribution layer is disposed on the encapsulant and has an outer side surface. The wetting layer is disposed on the outer side surface of the redistribution layer. The conductive via is disposed in the encapsulant and electrically connects the semiconductor chip and the redistribution layer.

In some embodiments, a semiconductor package structure includes a base material, at least one semiconductor chip, an encapsulant, a depression structure, a redistribution layer and at least one conductive via. The semiconductor chip is disposed on the base material. The encapsulant is disposed on the base material and covers the at least one semiconductor chip. The encapsulant has an outer side surface. The depression structure is disposed adjacent to and exposed from of the outer side surface the encapsulant. The redistribution layer is disposed on the encapsulant. The conductive via is disposed in the encapsulant and electrically connects the semiconductor chip and the redistribution layer.

In some embodiments, a method for manufacturing a semiconductor package structure includes: (a) providing a substrate including a plurality of base materials, wherein the substrate has at least one predetermined saw street; (b) disposing at least one semiconductor chip on a corresponding base material of the substrate; (c) forming an encapsulant on the base material of the substrate to cover the at least one semiconductor chip; (d) forming at least one first hole and at least one second hole in the encapsulant, wherein the first hole corresponds to the semiconductor chip, the second hole is disposed in the predetermined saw street, a capacity volume of the first hole is less than or equal to a capacity volume of the second hole; (e) forming a circuit layer on the encapsulant, wherein the circuit layer includes a redistribution layer disposed on the encapsulant, a conductive via in the first hole, and a periphery via in the second hole; and (f) conducting a singulation process along the predetermined saw street to form a plurality of semiconductor package structures, wherein a portion of the periphery via is removed.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
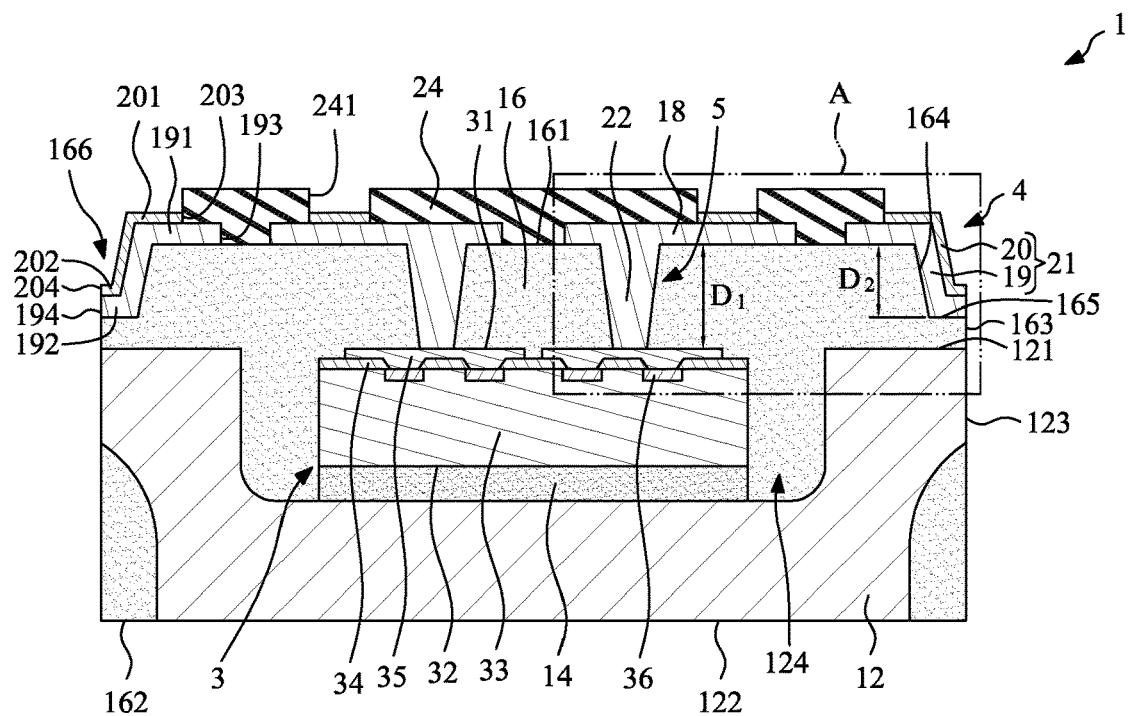
FIG. 1 illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
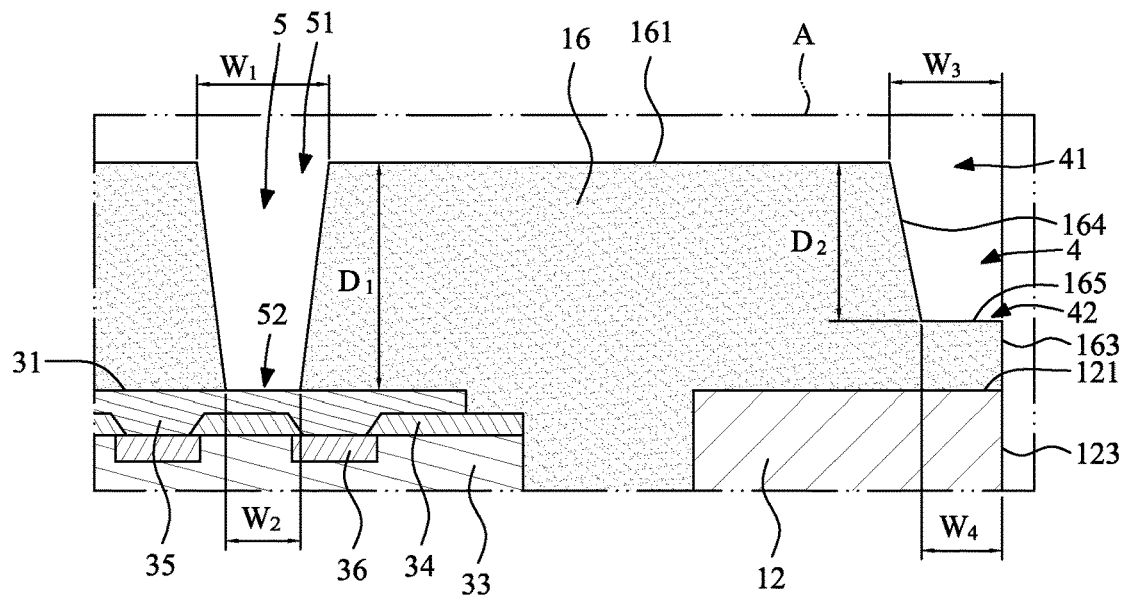
FIG. 2 illustrates an enlarged view of an area "A" shown in FIG. 1, wherein a depression structure and a protection layer are omitted for the purpose of the clear explanation.

FIG. 1 illustrates a cross-sectional view of a semiconductor package structure 1 according to some embodiments of the present disclosure. FIG. 2 illustrates an enlarged view of an area "A" shown in FIG. 1, wherein a depression structure and a protection layer are omitted for the purpose of the clear explanation. The semiconductor package structure 1 includes a base material 12, at least one semiconductor chip 3, an encapsulant 16, a redistribution layer 18, a depression structure 21 (including, for example, a lower structure 19 and a wetting layer 20), at least one conductive via 22 and a first protection layer 24.

The base material 12 may be a lead frame, an organic substrate, or other suitable carrier that can carry the semiconductor chip 3. As shown in FIG. 1, the base material 12 is a lead frame, and has a first surface 121 (e.g., a top surface), a second surface 122 (e.g., a bottom surface) opposite to the first surface 121, and a lateral peripheral surface 123 extending between the first surface 121 and the second surface 122. A material of the base material 12 is metal such as copper. The base material 12 may define a cavity 124 recessed from the first surface 121 (e.g., the top surface).

The semiconductor chip 3 may be disposed on and attached to the base material 12. As shown in FIG. 1, the semiconductor chip 3 is disposed in the cavity 124 of the base material 12. The semiconductor chip 3 has an active surface 31 (e.g., a top surface) and a backside surface 32 (e.g., a bottom surface) opposite to the active surface 31, and includes a chip body 33, a plurality of conductive pads 36, a passivation layer 34, and a circuit layer 35. A bottom surface of the chip body 33 is the backside surface 32 of the semiconductor chip 3, and is attached to a bottom surface of the cavity 124 of the base material 12 (e.g., a portion of the first surface 121) through an adhesion layer 14. The conductive pads 36 are in proximity to, adjacent to, or embedded in and exposed at a top surface of the chip body 33. The passivation layer 34 is disposed on and covers the top surface of the chip body 33, and defines a plurality of openings to expose respective ones of the conductive pads 36. The circuit layer 35 is disposed on the passivation layer 34, and extends into the openings of the passivation layer 34 to electrically connect the conductive pads 36. In some embodiments, the active surface 31 (e.g., the top surface) of the semiconductor chip 3 may be the top surface of the circuit layer 35, the top surface of the passivation layer 34, or the top surface of the chip body 33. In addition, the active surface 31 (e.g., the top surface) of the semiconductor chip 3 may be substantially coplanar with the first surface 121 of the base material 12. The active surface 31 of the semiconductor chip 3 faces the redistribution layer 18.

The encapsulant 16 may be disposed on the base material 12 and cover the semiconductor chip 3. As shown in FIG. 1, the encapsulant 16 covers the first surface 121 of the base material 12 and extends into the cavity 124 of the base material 12. The encapsulant 16 has a first surface 161 (e.g., a top surface), a second surface 162 (e.g., a bottom surface), an outer side surface 163, an inner lateral surface 164 and a plurality of corner portions 166. The second surface 162 is opposite to the first surface 161. The outer side surface 163 extends between the first surface 161 and the second surface 162, that is, the outer side surface 163 may be connected to the first surface 161 and/or the second surface 162. The inner lateral surface 164 is recessed form the outer side surface 163. As shown in FIG. 1, the inner lateral surface 164 is a curved surface formed from a blind hole that does not extend through the encapsulant 16, and may be connected to the first surface 161. Such blind hole does not extend to the first surface 121 of the base material 12. That is, the inner lateral surface 164 may not be connected to the first surface 121 of the base material 12. In some embodiments, such blind hole may have an inner bottom surface 165 spaced apart from the first surface 121 of the base material 12. Thus, the inner lateral surface 164 extends between the first surface 161 and the inner bottom surface 165. In some embodiments, the inner lateral surface 164 of the encapsulant 16 is inclined with respect to the first surface 161 of the encapsulant 16. That is, the inner lateral surface 164 is not perpendicular to the first surface 161 and the inner bottom surface 165. As shown in FIG. 1, an inclination angle between the inner lateral surface 164 and the first surface 161 of the encapsulant 16 is greater than 90 degrees. In addition, the corner portions 166 are defined by the first surface 161 and the outer side surface 163 of the encapsulant 16.

A material of the encapsulant 16 may be a molding compound with or without fillers, or a dielectric layer, and may include, or be formed from, a photoresist layer, a cured photosensitive material, a cured photoimageable dielectric (PID) material such as a polyamide (PA), an Ajinomoto build-up film (ABF), a bismaleimide-triazine (BT), a polyimide (PI), epoxy or polybenzoxazole (PBO), or a combination of two or more thereof.

As shown in FIG. 1 and FIG. 2, the encapsulant 16 may further define at least one first hole 5 and an indentation structure 4. The first hole 5 is used for accommodating the conductive via 22, and the indentation structure 4 is used for accommodating the depression structure 21. The first hole 5 extends between the first surface 161 of the encapsulant 16 and the active surface 31 of the semiconductor chip 3. Thus, a portion of the circuit layer 35 is exposed from the first hole 5. In some embodiments, the first hole 5 includes a first portion (e.g., top portion) 51 and a second portion (e.g., bottom portion) 2. A first width $W_1$ of the first portion 51 is greater than a second width $W_2$ of the second portion 52 (e.g., may be about 1.1 or more times greater, about 1.3 or more times greater, about 1.5 or more times greater, or about 1.7 or more times greater). That is, the first hole 5 is tapered from the first portion (top portion) 51 to the second portion (bottom portion) 52. This is because that the first hole 5 may be formed by laser drilling.

The indentation structure 4 is the space defined by the inner lateral surface 164 and the inner bottom surface 165 of the encapsulant 16. That is, the inner lateral surface 164 of the encapsulant 16 is the sidewall of the indentation structure 4, and a portion of the encapsulant 16 is disposed between the inner bottom surface 165 and the first surface 121 of the base material 12. The indentation structure 4 is disposed on the corner portion 166 of the encapsulant 16, and is recessed from the first surface 161 of the encapsulant 16 and the outer side surface 163 of the encapsulant 16. In some embodiments, the indentation structure 4 includes a first portion (e.g., top portion) 41 and a second portion (e.g., bottom portion) 42. A third width $W_3$ of the first portion 41 is greater than a fourth width $W_4$ of the second portion 42 (e.g., may be about 1.1 or more times greater, about 1.3 or more times greater, about 1.5 or more times greater, or about 1.7 or more times greater). That is, the indentation structure 4 is tapered from the first portion (e.g., top portion) 41 to the second portion (e.g., bottom portion) 42. This is because that the inner lateral surface 164 of the encapsulant 16 is formed from a hole that is formed by laser drilling. In addition, a first depth $D_1$ of the first hole 5 is greater than a second depth $D_2$ of the indentation structure 4 (e.g., may be about 1.1 or more times greater, about 1.3 or more times greater, about 1.5 or more times greater, or about 1.7 or more times greater).

As shown in FIG. 1, the redistribution layer 18 is disposed on the first surface 161 of the encapsulant 16. The redistribution layer 18 may be a patterned circuit layer. For example, the redistribution layer 18 may include a seed layer and a conductive metal layer disposed in that order on the encapsulant 16. The seed layer may include, for example, titanium and/or copper, another metal, or an alloy, and may be formed or disposed by sputtering. The conductive metal layer may include, for example, copper, or another metal or combination of metals, and may be formed or disposed by electroplating. In some embodiments, the redistribution layer 18 may include a plurality of conductive traces and/or a plurality of bonding pads.

The conductive via 22 is disposed in the first hole 5 of the encapsulant 16 and electrically connects the active surface 31 of semiconductor chip 3 and the redistribution layer 18. For example, the conductive via 22 may include the seed layer and the conductive metal layer of the redistribution layer 18. That is, the conductive via 22 and the redistribution layer 18 may be formed concurrently and integrally. The conductive via 22 may fills the first hole 5.

The depression structure 21 is disposed along and on the inner lateral surface 164 and inner bottom surface 165 of the encapsulant 16 in the indentation structure 4, that is, at least a portion of the depression structure 21 is disposed within the indentation structure 4 and at the corner portion 166 of the encapsulant 16. Thus, the depression structure 21 is disposed adjacent to and exposed from of the outer side surface 163 the encapsulant 16. In some embodiments, the depression structure 21 may be a solder wetting structure (e.g., a solder wettable flank), and may include the lower structure 19 and the wetting layer 20 disposed on the lower structure 19. In some embodiments, the lower structure 19 and the redistribution layer 18 are formed concurrently and integrally. That is, the lower structure 19 and the redistribution layer 18 may be the same layer, and the lower structure 19 may be a portion of the redistribution layer 18. Thus, the lower structure 19 may include two metal layers that are the same as the redistribution layer 18.

As shown in FIG. 1, the lower structure 19 includes a first end 191 and a second end 192. The first end 191 is disposed on the first surface 161 of the encapsulant 16, and has an inner lateral surface 193. The second end 192 is disposed on the inner lateral surface 164 and/or the inner bottom surface 165 of the encapsulant 16, and has an outer side surface 194. The wetting layer 20 is a solder wetting layer. For example, the wetting layer 20 may an electroless nickel immersion gold (ENIG) layer. As shown in FIG. 1, the wetting layer 20 includes a first end 201 and a second end 202. The first end 201 is disposed on the first end 191 of the lower structure 19, and has an inner lateral surface 203. Thus, a portion of the depression structure 21 is disposed on the first surface 161 of the encapsulant 16. The second end 202 is disposed on the second end 192 of the lower structure 19, and has an outer side surface 204. Further, the inner lateral surface 203 of the wetting layer 20 may not be coplanar with the inner lateral surface 193 of the lower structure 19. Further, the outer side surface 204 of the wetting layer 20 may be substantially coplanar with the outer side surface 194 of the lower structure 19 and the outer side surface 163 the encapsulant 16 since they are formed concurrently after a cutting process.

As shown in FIG. 1, the depression structure 21 has a bottom end, and the conductive via 22 has a bottom end. A distance $D_2$ between the first surface 161 of the encapsulant 16 and the bottom end of the depression structure 21 (e.g., the second depth $D_2$ of the indentation structure 4) is less than a distance $D_1$ between the first surface 161 of the encapsulant 16 and the bottom end of the conductive via 22 (e.g., the first depth $D_1$ of the first hole 5).

The first protection layer 24 is disposed on the first surface 161 of the encapsulant 16 and covers the redistribution layer 18. The first protection layer 24 defines a plurality of openings 241 to expose portions (e.g., the bonding pads) of the redistribution layer 18 and the depression structure 21.

The first protection layer 24 may include a solder resist material, such as, for example, epoxy acrylate, benzocyclobutene (BCB) or polyimide. As shown in FIG. 1, portions of the wetting layer 20 are further disposed in the openings 241 on the exposed portions (e.g., the bonding pads) of the redistribution layer 18.

Figure 3:
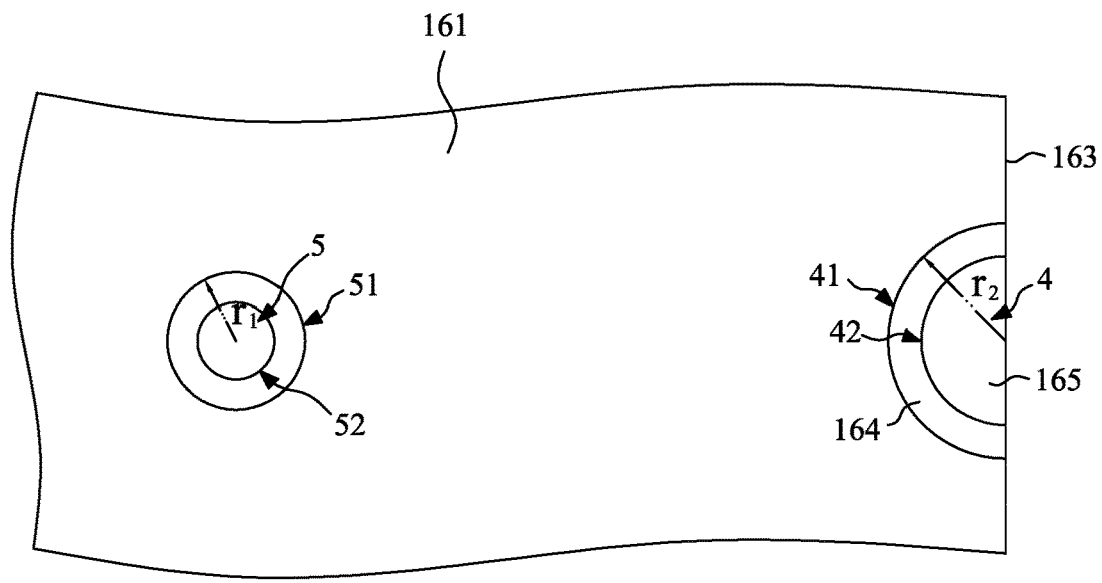
FIG. 3 illustrates a top view of the portion of FIG. 2.

FIG. 3 illustrates a top view of the portion of FIG. 2. The shape of the indentation structure 4 may be semi-circular or semi-elliptical, and the shape of the first hole 5 may be circular or elliptical. As shown in FIG. 3, a radius of curvature $r_2$ of the top portion 41 of the indentation structure 4 of the encapsulant 16 is greater than or equal to a radius of curvature $r_1$ of the top portion 51 of the first hole 5 of the encapsulant 16. In some embodiments, the radius of curvature $r_2$ of the top portion 41 of the indentation structure 4 may be equal to the third width $W_3$ (FIG. 2) of the first portion 41 of the indentation structure 4. The radius of curvature $r_1$ of the top portion 51 of the first hole 5 may be one half of the first width $W_1$ (FIG. 2) of the first portion 51 of the first hole 5. Therefore, in FIG. 2, the third width $W_3$ of the first portion 41 of the indentation structure 4 is greater than one half of the first width $W_1$ of the first portion 51 of the first hole 5.

Figure 4:
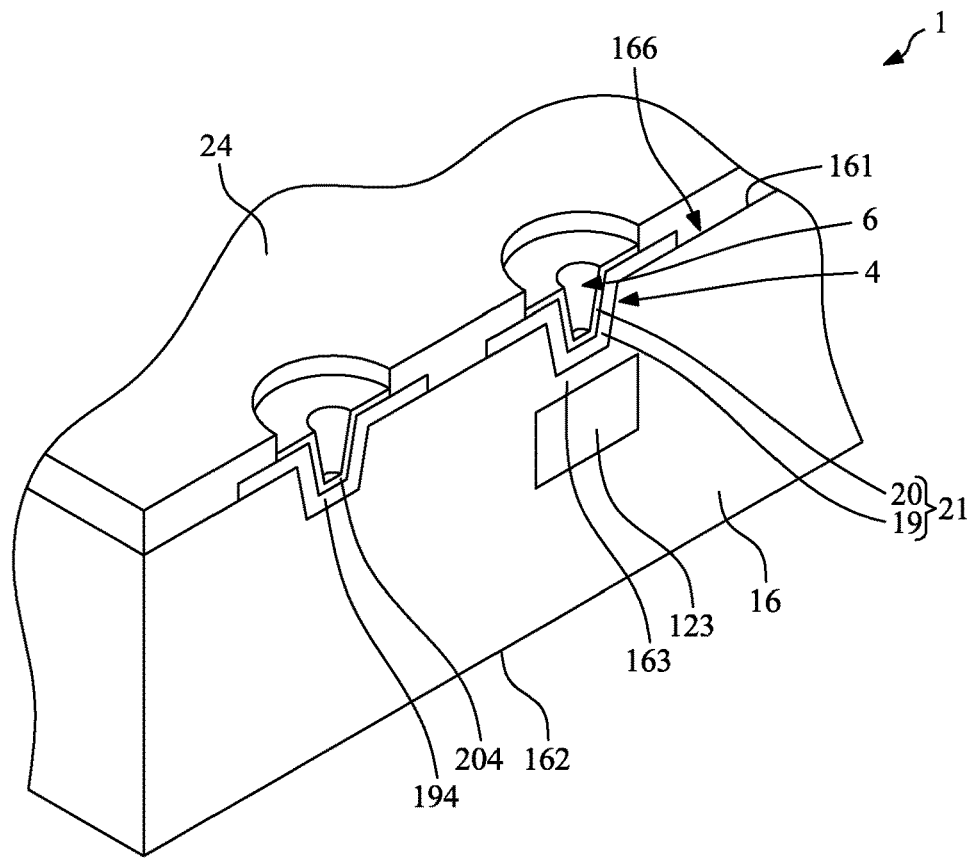
FIG. 4 illustrates a perspective view of a portion of the semiconductor package structure of FIG. 1.

FIG. 4 illustrates a perspective view of a portion of the semiconductor package structure 1 of FIG. 1. The depression structure 21 defines a recess portion 6 recessed from the outer side surface 163 of the encapsulant 16. That is, the depression structure 21 does not fill the indentation structure 4. The recess portion 6 is conformal with the indentation structure 4 or the inner lateral surface 164 of the encapsulant 16.

In the illustrated embodiment of the semiconductor package structure 1 shown in FIG. 1 through FIG. 4, the semiconductor package structure 1 may be an embedded chip package. When the semiconductor package structure 1 is attached to a motherboard by using, for example, surface mounting technique (SMT), solder can wick up the recess portion 6 of the depression structure 21 and form a solder fillet which can be inspected for joint quality, and the yield rate and the soldering reliability of the surface mounting technique (SMT) are improved.

Figure 5:
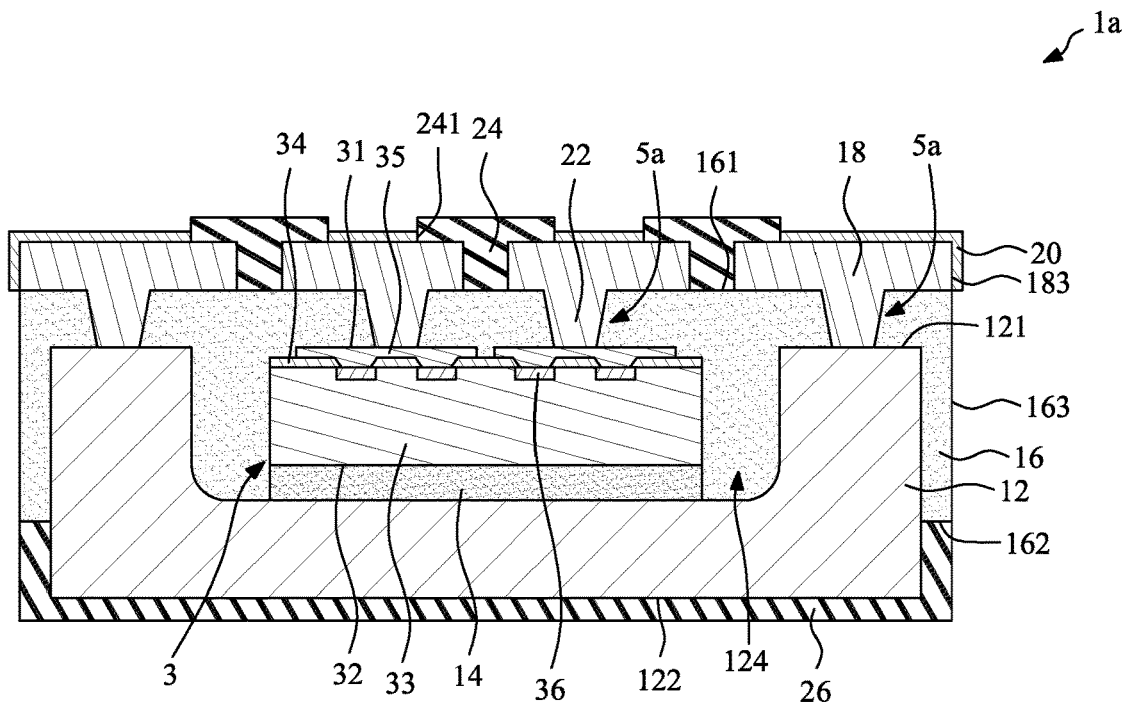
FIG. 5 illustrates a cross-sectional view of a semiconductor package structure according to some embodiments of the present disclosure.

FIG. 5 illustrates a cross-sectional view of a semiconductor package structure 1a according to some embodiments of the present disclosure. The semiconductor package structure 1a is similar to the semiconductor package structure 1 shown in FIG. 1 through FIG. 4, except for the structure of the depression structure 21. As shown in FIG. 5, the semiconductor package structure 1a does not include the depression structure 21 of FIG. 1. The redistribution layer 18 of FIG. 5 has an outer side surface 183. The outer side surface 183 of the redistribution layer 18 is substantially coplanar with the outer side surface 163 of the encapsulant 16 since they are formed concurrently after a cutting process. A portion of the wetting layer 20 is disposed on the outer side surface 183 of the redistribution layer 18. Thus, the portion of the wetting layer 20 and the outer side surface 183 of the redistribution layer 18 form a solder wettable flank. Further, the conductive via 22 may be disposed in the first hole 5a, and some conductive via 22 may be connected the first surface 121 of the base material 12. In addition, the second surface 122 of the base material 12 may be exposed from the second surface 162 of the encapsulant 16, and a second protection layer 26 is further included to cover the second surface 122 of the base material 12 and the second surface 162 of the encapsulant 16. A material of the second protection layer 26 may be same as or different from the material of the first protection layer 24.

Figure 6:
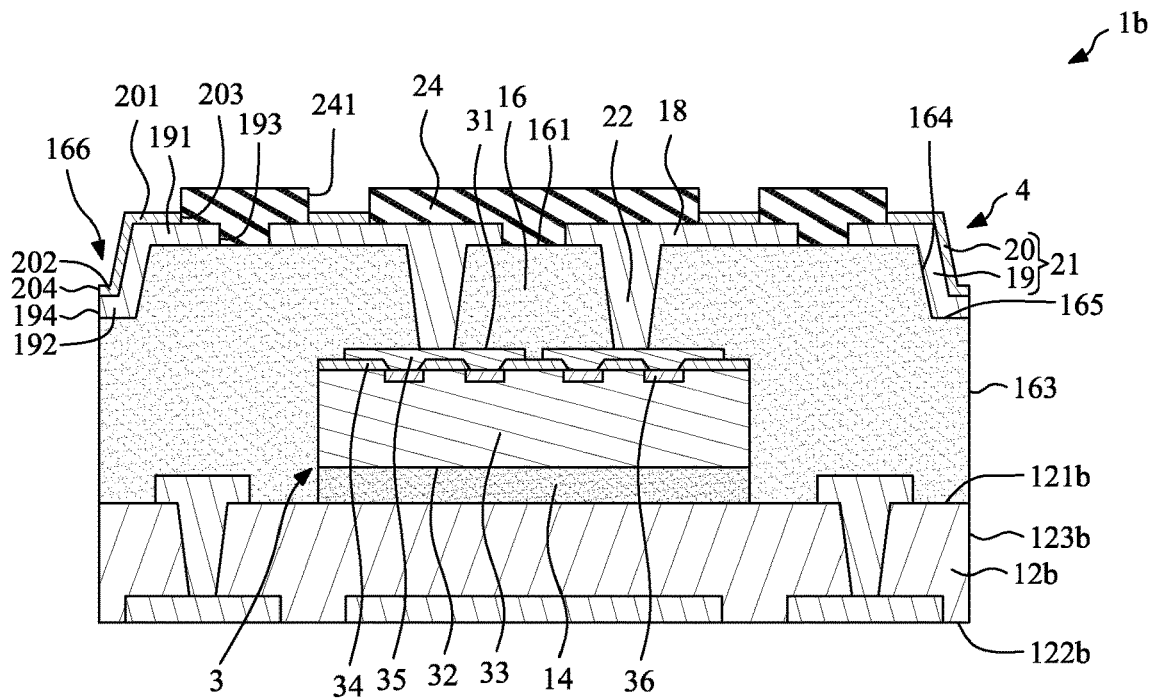
FIG. 6 illustrates a cross-sectional view of a semiconductor package structure according to some embodiments of the present disclosure.

FIG. 6 illustrates a cross-sectional view of a semiconductor package structure 1b according to some embodiments of the present disclosure. The semiconductor package structure 1b is similar to the semiconductor package structure 1 shown in FIG. 1 through FIG. 4, except for the structure of the base material 12b. As shown in FIG. 6, the base material 12b is an organic substrate, and may include at least one dielectric structure and at least one circuitry structure embedded in the dielectric structure. The base material 12b has a first surface 121b (e.g., a top surface), a second surface 122b (e.g., a bottom surface) opposite to the first surface 121b, and a lateral peripheral surface 123b extending between the first surface 121b and the second surface 122b.

Figure 7:
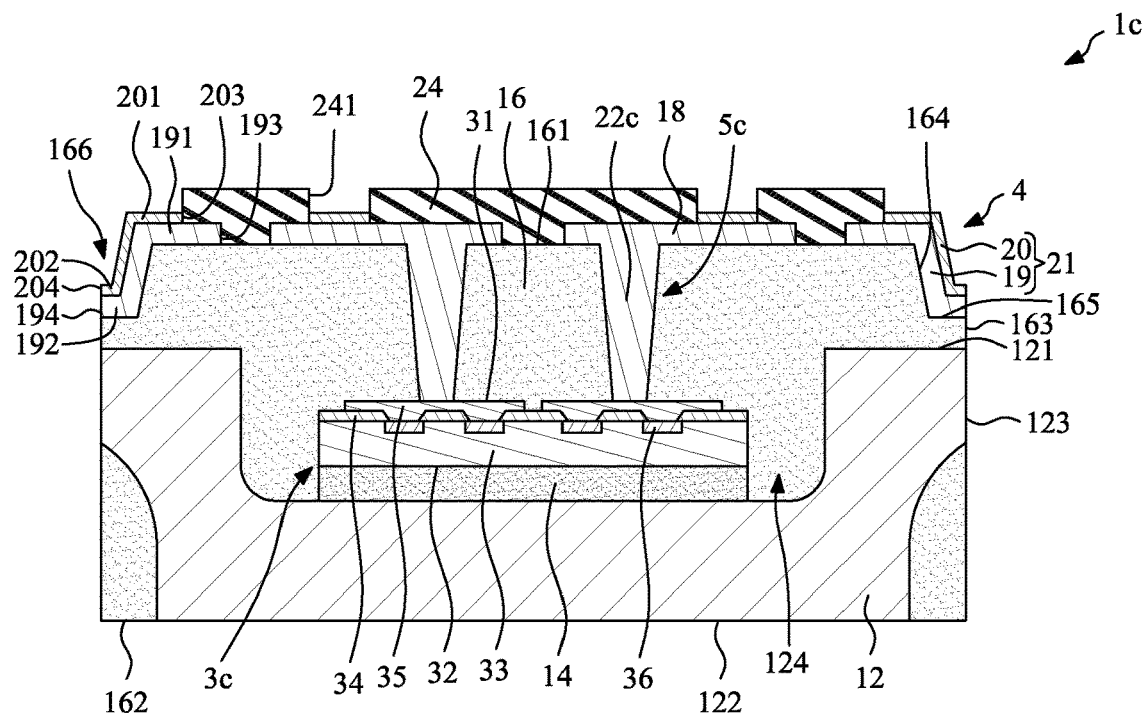
FIG. 7 illustrates a cross-sectional view of a semiconductor package structure according to some embodiments of the present disclosure.

FIG. 7 illustrates a cross-sectional view of a semiconductor package structure 1c according to some embodiments of the present disclosure. The semiconductor package structure 1c is similar to the semiconductor package structure 1 shown in FIG. 1 through FIG. 4, except for the structure of the semiconductor chip 3c. As shown in FIG. 7, a thickness of the semiconductor chip 3c is less than a thickness of the semiconductor chip 3 of FIG. 1, and the first surface 31 of the semiconductor chip 3c is lower than the first surface 121 of the base material 12. The conductive via 22c is disposed in the first hole 5c. A depth of the first hole 5c of FIG. 7 is greater than the first depth $D_1$ of the first hole 5 of FIG. 1.

Figure 8:
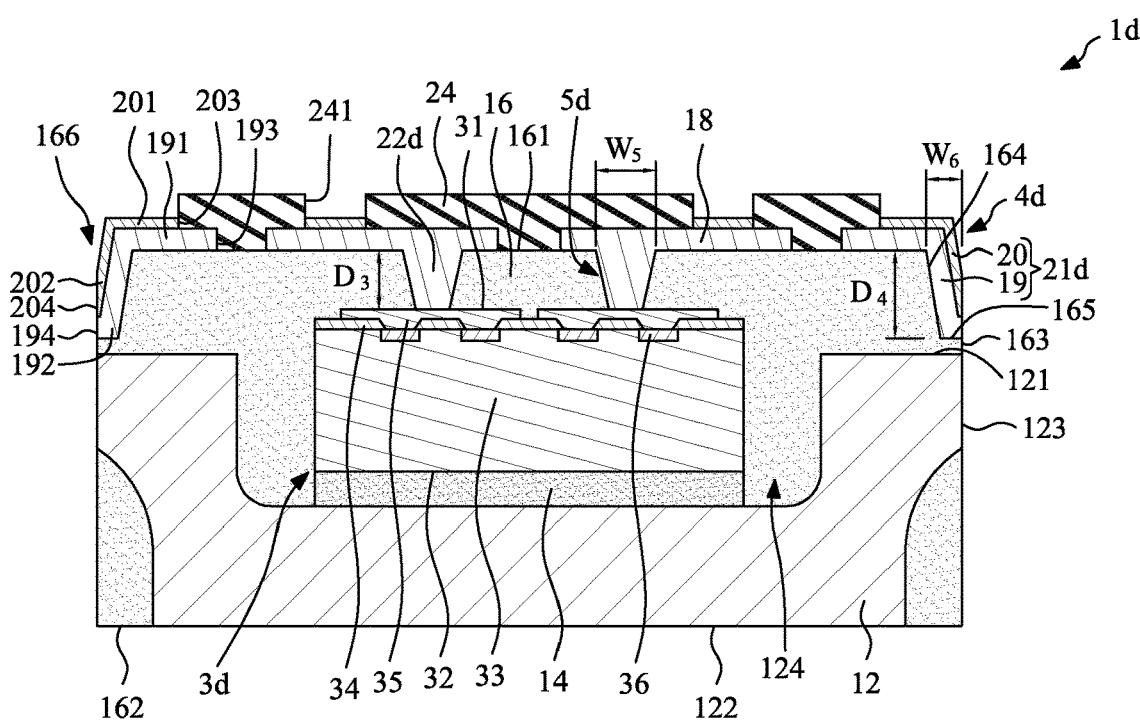
FIG. 8 illustrates a cross-sectional view of a semiconductor package structure according to some embodiments of the present disclosure.

FIG. 8 illustrates a cross-sectional view of a semiconductor package structure 1d according to some embodiments of the present disclosure. The semiconductor package structure 1d is similar to the semiconductor package structure 1 shown in FIG. 1 through FIG. 4, except for the structures of the semiconductor chip 3d and the indentation structure 4d. As shown in FIG. 8, a thickness of the semiconductor chip 3d is greater than a thickness of the semiconductor chip 3 of FIG. 1, and the first surface 31 of the semiconductor chip 3d is higher than the first surface 121 of the base material 12. Further, a first depth $D_3$ of the first hole 5d is less than a second depth $D_4$ of the indentation structure 4d. That is, the distance $D_4$ between the first surface 161 of the encapsulant 16 and the bottom end of the depression structure 21d is greater than the distance $D_3$ between the first surface 161 of the encapsulant 16 and the bottom end of the conductive via 22d. In addition, the sixth width $W_6$ of the first portion (e.g., top portion) of the indentation structure 4d is substantially equal to one half of the fifth width $W_5$ of the first portion (e.g., top portion) of the first hole 5d.

Figure 9:
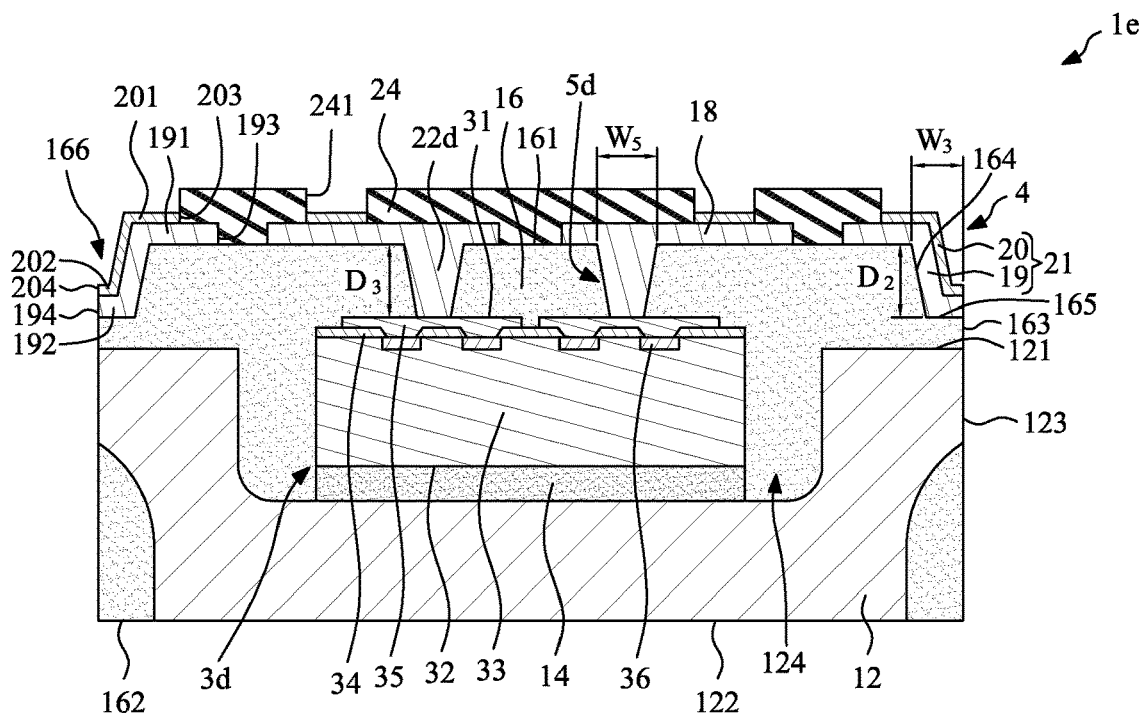
FIG. 9 illustrates a cross-sectional view of a semiconductor package structure according to some embodiments of the present disclosure.

FIG. 9 illustrates a cross-sectional view of a semiconductor package structure 1e according to some embodiments of the present disclosure. The semiconductor package structure 1e is similar to the semiconductor package structure 1 shown in FIG. 1 through FIG. 4, except for the structure of the semiconductor chip 3d. As shown in FIG. 9, a thickness of the semiconductor chip 3d is greater than a thickness of the semiconductor chip 3 of FIG. 1, and the first surface 31 of the semiconductor chip 3d is higher than the first surface 121 of the base material 12. Further, a first depth $D_3$ of the first hole 5d is substantially equal to the second depth $D_2$ of the indentation structure 4. That is, the distance $D_2$ between the first surface 161 of the encapsulant 16 and the bottom end of the depression structure 21 is substantially equal to the distance $D_3$ between the first surface 161 of the encapsulant 16 and the bottom end of the conductive via 22d. In addition, the third width $W_3$ of the first portion 41 (e.g., top portion) of the indentation structure 4 is substantially greater than one half of the fifth width $W_5$ of the first portion (e.g., top portion) of the first hole 5d.

Figure 10:
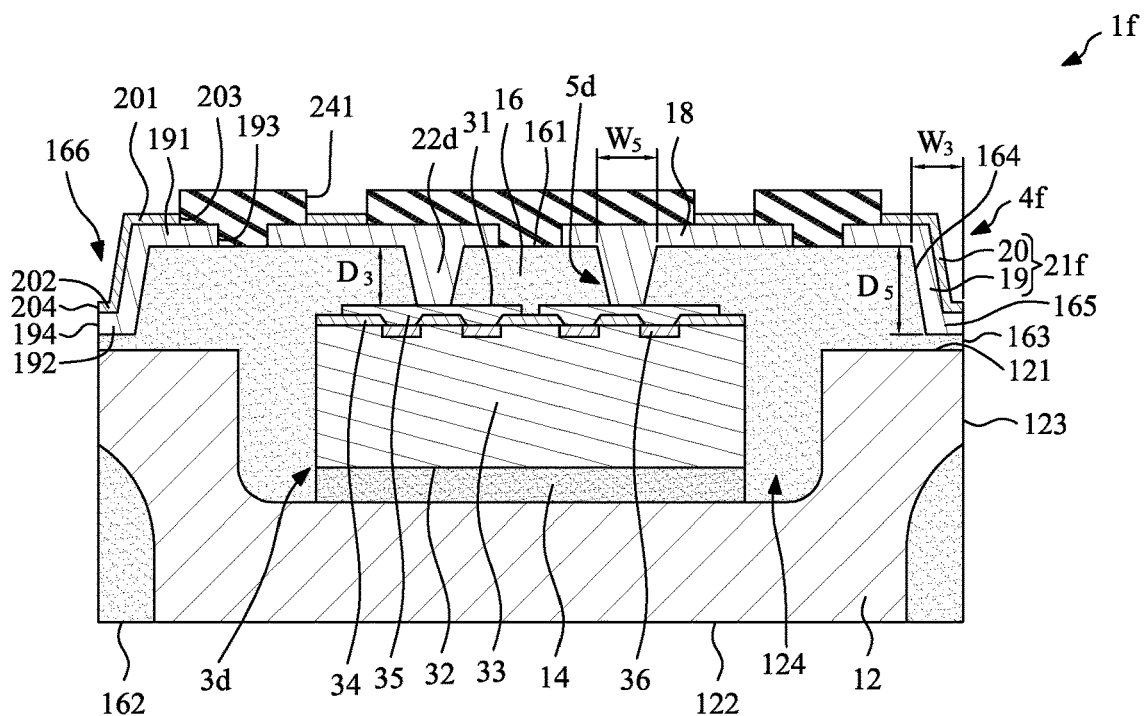
FIG. 10 illustrates a cross-sectional view of a semiconductor package structure according to some embodiments of the present disclosure.

FIG. 10 illustrates a cross-sectional view of a semiconductor package structure if according to some embodiments of the present disclosure. The semiconductor package structure 1f is similar to the semiconductor package structure 1 shown in FIG. 1 through FIG. 4, except for the structures of the semiconductor chip 3d and the indentation structure 4f. As shown in FIG. 10, a thickness of the semiconductor chip 3d is greater than a thickness of the semiconductor chip 3 of FIG. 1, and the first surface 31 of the semiconductor chip 3d is higher than the first surface 121 of the base material 12. Further, a first depth $D_3$ of the first hole 5d is less than the second depth $D_5$ of the indentation structure 4f. That is, the distance $D_5$ between the first surface 161 of the encapsulant 16 and the bottom end of the depression structure 21f is less than the distance $D_3$ between the first surface 161 of the encapsulant 16 and the bottom end of the conductive via 22d. In addition, the third width $W_3$ of the first portion 41 (e.g., top portion) of the indentation structure 4f is substantially greater than one half of the fifth width $W_5$ of the first portion (e.g., top portion) of the first hole 5d.

Figure 11:
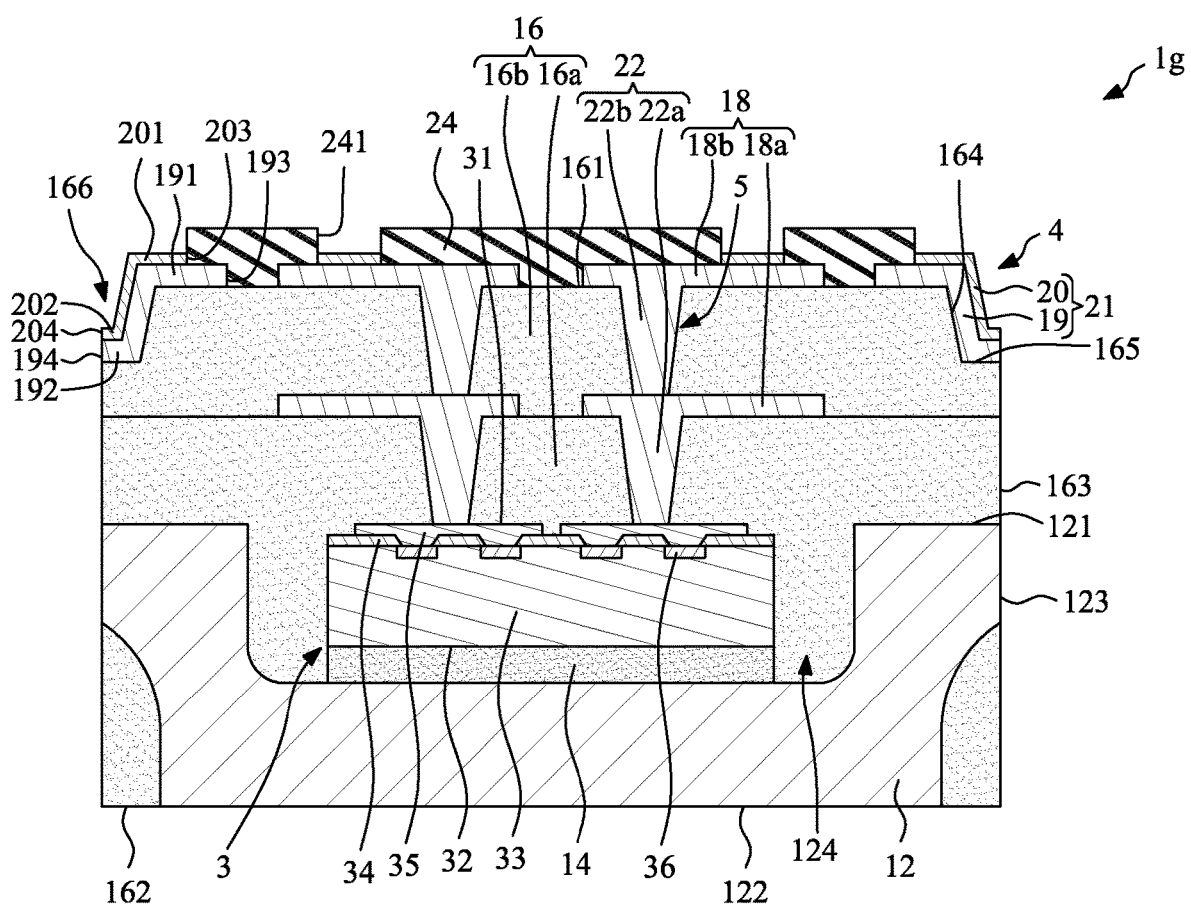
FIG. 11 illustrates a cross-sectional view of a semiconductor package structure according to some embodiments of the present disclosure.

FIG. 11 illustrates a cross-sectional view of a semiconductor package structure 1g according to some embodiments of the present disclosure. The semiconductor package structure 1g is similar to the semiconductor package structure 1 shown in FIG. 1 through FIG. 4, except that the encapsulant 16 includes a first encapsulant 16a and a second encapsulant 16b, the conductive via 22 includes a first conductive via 22a and a second conductive via 22b, and the redistribution layer 18 includes a first redistribution layer 18a and a second redistribution layer 18b. The first encapsulant 16a may be disposed on the base material 12 and cover the semiconductor chip 3. As shown in FIG. 11, the first encapsulant 16a covers the first surface 121 of the base material 12 and extends into the cavity 124 of the base material 12. The first redistribution layer 18a is disposed on the first encapsulant 16a. The first conductive via 22a is disposed in the first hole 5 of the first encapsulant 16a and electrically connects the active surface 31 of semiconductor chip 3 and the first redistribution layer 18a. In addition, the second encapsulant 16b may be disposed on the first encapsulant 16a and cover the first redistribution layer 18a. The second redistribution layer 18b is disposed on the second encapsulant 16b. The second conductive via 22b is disposed in the first hole 5 of the second encapsulant 16b and electrically connects the second redistribution layer 18b and the first redistribution layer 18a. As shown in FIG. 11, the depression structure 21 and the indentation structure 4 are disposed at the corner 166 of the second encapsulant 16b. However, the depression structure 21 may extend through the second encapsulant 16b and extend into the first encapsulant 16a.

FIG. 12 through FIG. 19 illustrate a method for manufacturing a semiconductor package structure according to some embodiments of the present disclosure. In some embodiments, the method is for manufacturing a semiconductor package structure such as the semiconductor package structure 1 shown in FIG. 1 to FIG. 4.

Figure 12:
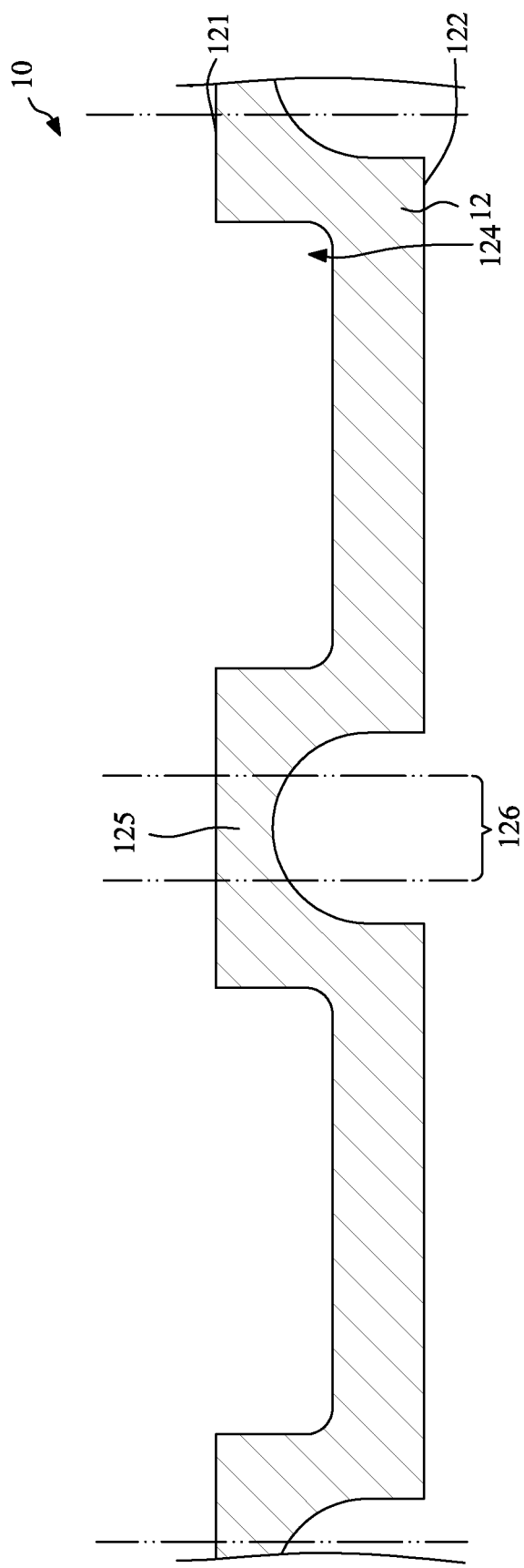
FIG. 12 illustrates one or more stages of an example of a method for manufacturing a semiconductor package structure according to some embodiments of the present disclosure.

Referring to FIG. 12, a substrate 10 is provided. The substrate 10 may be a strip or a panel, and may include a plurality of base materials 12 and a plurality of connecting bars 125 connecting the base materials 12. In some embodiments, the substrate 10 may have at least one predetermined saw street 126 corresponding to the connecting bar 125. The substrate 10 may be a lead frame assembly structure, and each of the base materials 12 may be a lead frame. As shown in FIG. 12, each of the base materials 12 has a first surface 121 (e.g., a top surface) and a second surface 122 (e.g., a bottom surface) opposite to the first surface 121, and may define a cavity 124 recessed from the first surface 121 (e.g., the top surface).

Figure 13:
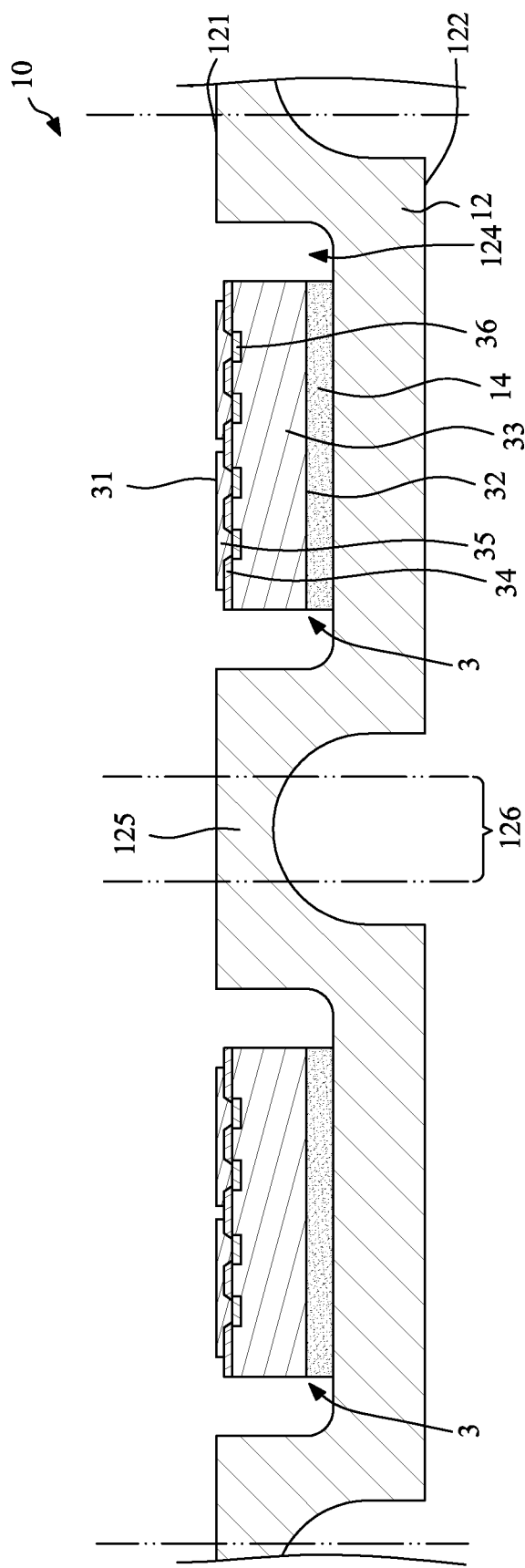
FIG. 13 illustrates one or more stages of an example of a method for manufacturing a semiconductor package structure according to some embodiments of the present disclosure.

Referring to FIG. 13, at least one semiconductor chip 3 may be disposed on and attached to the corresponding base material 12 of the substrate 10. The semiconductor chip 3 of FIG. 13 is same as the semiconductor chip 3 of FIG. 1. A backside surface 32 of the semiconductor chip 3 is attached to a bottom surface of the cavity 124 of the base material 12 through an adhesion layer 14. In addition, the active surface 31 (e.g., the top surface) of the semiconductor chip 3 may be substantially coplanar with the first surface 121 of the base material 12.

Figure 14:
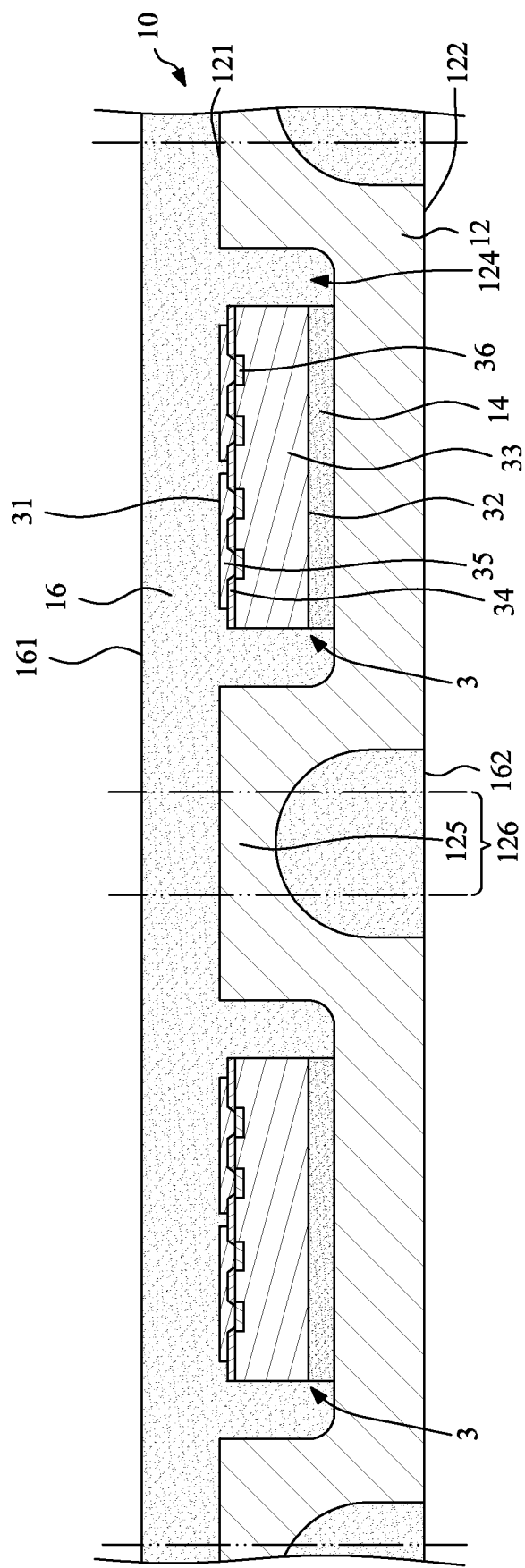
FIG. 14 illustrates one or more stages of an example of a method for manufacturing a semiconductor package structure according to some embodiments of the present disclosure.

Referring to FIG. 14, an encapsulant 16 is formed or disposed on the base material 12 of the substrate 10 to cover the semiconductor chip 3. As shown in FIG. 14, the encapsulant 16 covers the first surface 121 of the base material 12 and extends into the cavity 124 of the base material 12. The encapsulant 16 has a first surface 161 (e.g., a top surface) and a second surface 162 (e.g., a bottom surface) opposite to the first surface 161. A material of the encapsulant 16 may be a molding compound with or without fillers, or a dielectric layer, and may include, or be formed from, a photoresist layer, a cured photosensitive material, a cured photoimageable dielectric (PID) material such as a polyamide (PA), an Ajinomoto build-up film (ABF), a bismaleimide-triazine (BT), a polyimide (PI), epoxy or polybenzoxazole (PBO), or a combination of two or more thereof.

Figure 15:
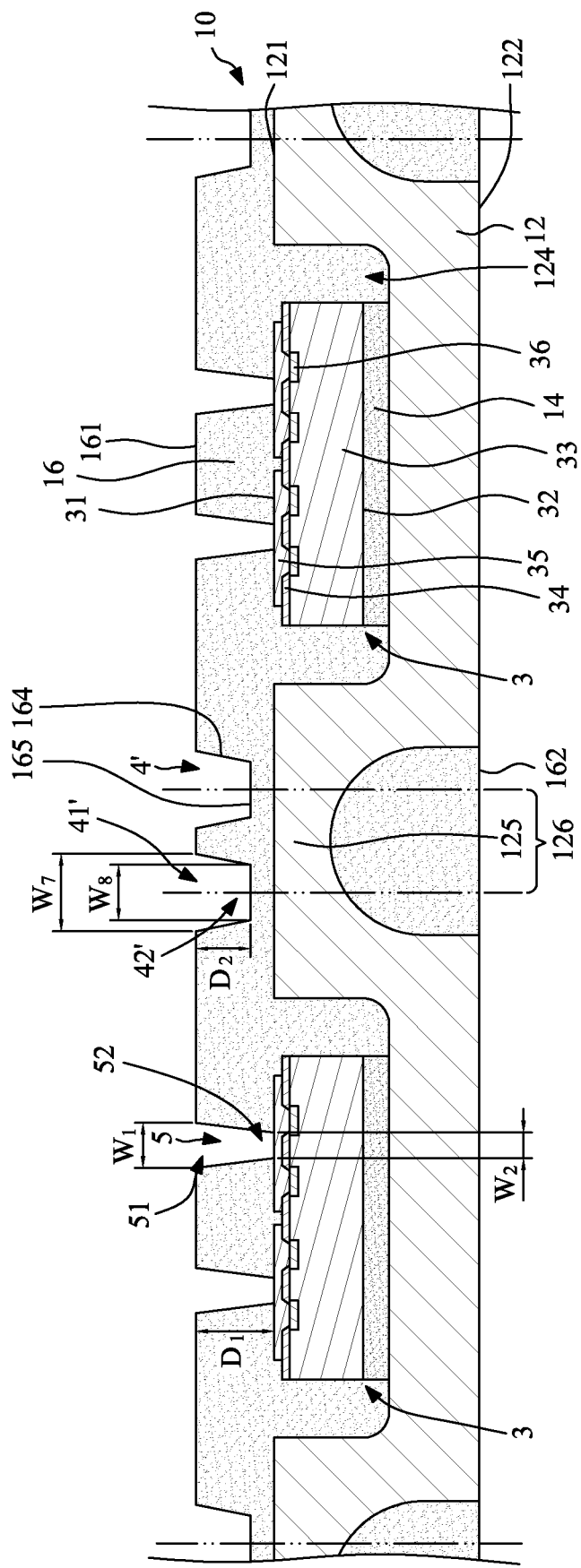
FIG. 15 illustrates one or more stages of an example of a method for manufacturing semiconductor package structure according to some embodiments of the present disclosure.

Referring to FIG. 15, at least one first hole 5 and at least one second hole 4' are formed in the encapsulant 16, and are recessed from the first surface 161 (e.g., a top surface) of the encapsulant 16. The position of the first hole 5 corresponds to the semiconductor chip 3, and the second hole 4' is disposed in the predetermined saw street 126. In some embodiments, the first hole 5 exposes a portion of the first surface 31 of the semiconductor chip 3, and the second hole 4' does not expose the first surface 121 of the base material 12. The second hole 4' is defined by the inner lateral surface 164 and the inner bottom surface 165 of the encapsulant 16. As shown in FIG. 15, the first hole 5 includes a first portion (e.g., top portion) 51 and a second portion (e.g., bottom portion) 2. A first width $W_1$ of the first portion 51 is greater than a second width $W_2$ of the second portion 52. That is, the first hole 5 is tapered from the first portion (top portion) 51 to the second portion (bottom portion) 52. This is because that the first hole 5 may be formed by laser drilling. Further, the second hole 4' includes a first portion (e.g., top portion) 41' and a second portion (e.g., bottom portion) 42'. A seventh width $W_7$ of the first portion 41' is greater than an eighth width $W_8$ of the second portion 42'. That is, the second hole 4' is tapered from the first portion (e.g., top portion) 41' to the second portion (e.g., bottom portion) 42'. This is because that the second hole 4' may be formed by laser drilling. In addition, In addition, a first depth $D_1$ of the first hole 5 is greater than a second depth $D_2$ of the second hole 4', the width $W_7$ of the first portion 41' of the second hole 4' is greater than the first width $W_1$ of the first portion 51 of the first hole 5, and a capacity volume of the first hole 5 is less than a capacity volume of the second hole 4'.

Figure 16:
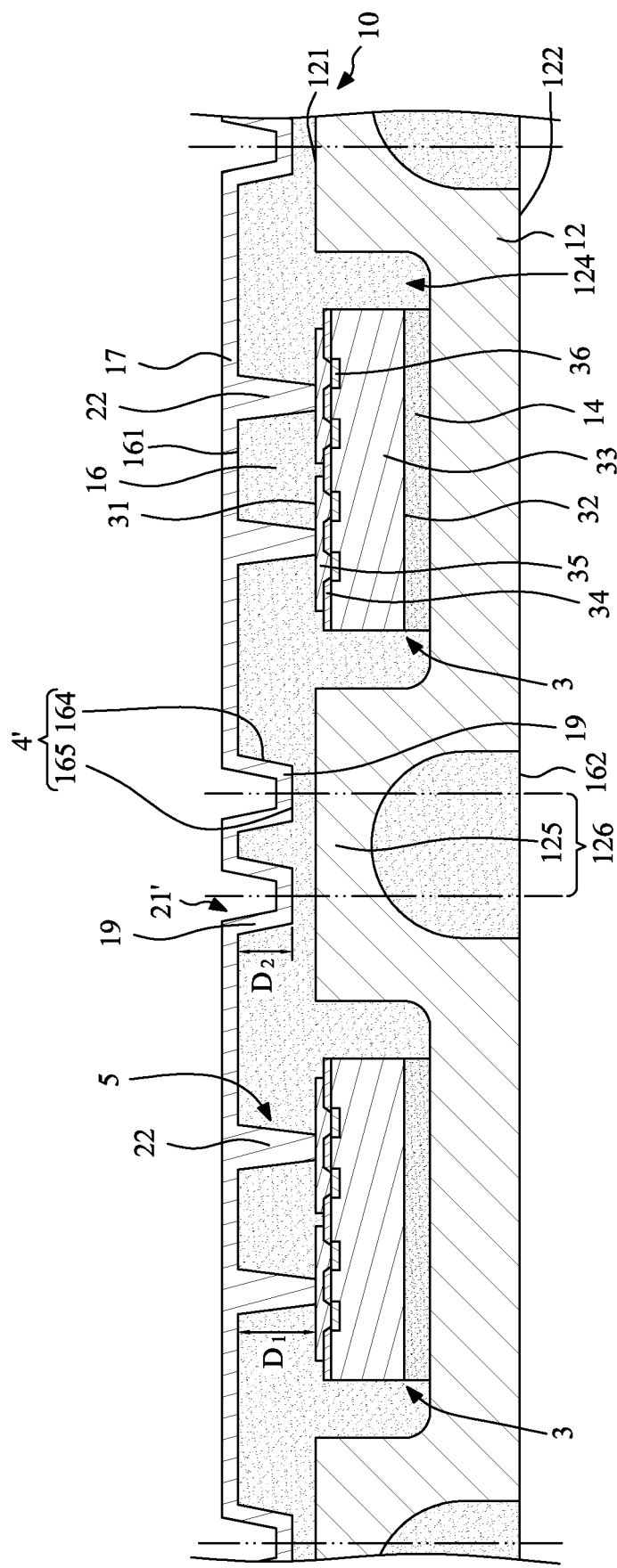
FIG. 16 illustrates one or more stages of an example of a method for manufacturing a semiconductor package structure according to some embodiments of the present disclosure.

Referring to FIG. 16, a conductive material 17 (such as metal material) is formed or disposed on the first surface 161 (e.g., a top surface) of the encapsulant 16, in the first hole 5 and in the second hole 4'. As shown in FIG. 16, the conductive material 17 fills the first hole 5 to form at least one conductive via 22. Meanwhile, the conductive material 17 does not fill the second hole 4', and forms a periphery via 21' including a lower structure 19 on the inner lateral surface 164 and the inner bottom surface 165 of the encapsulant 16. The lower structure 19 of the periphery via 21' defines a central hole.

Figure 17:
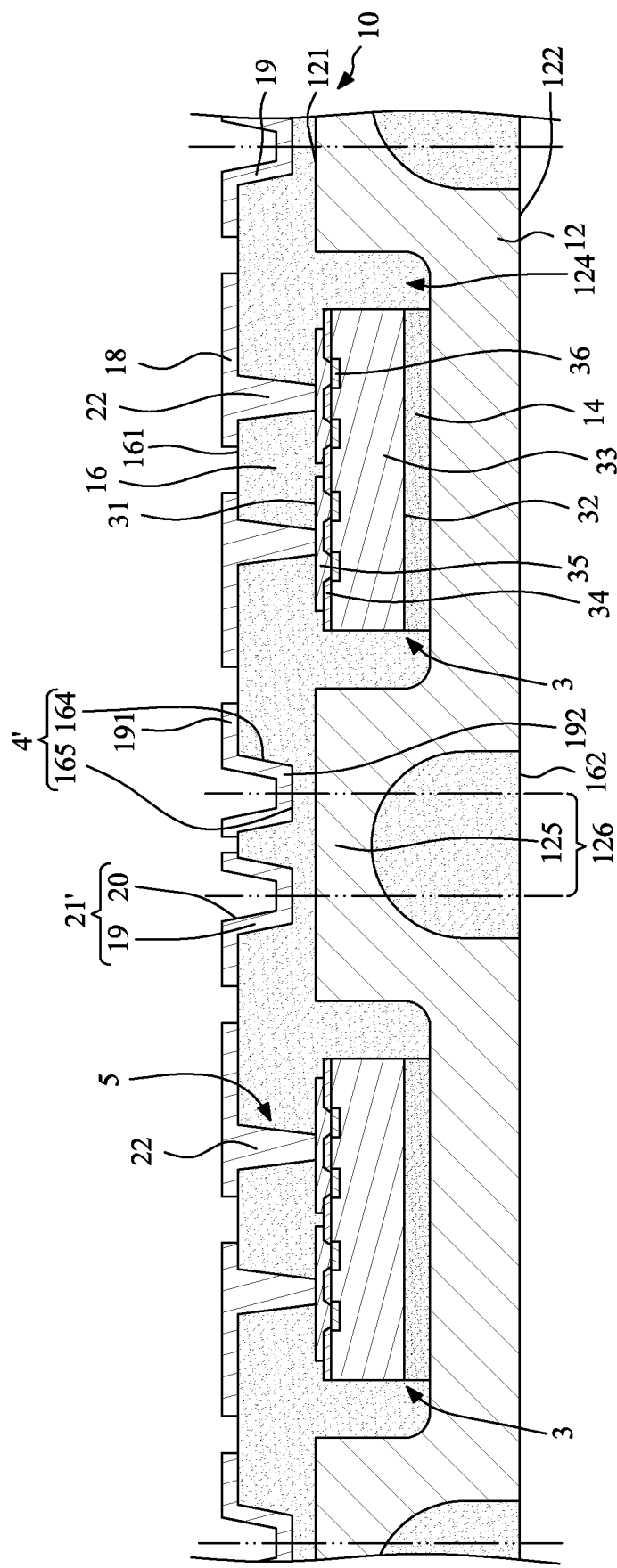
FIG. 17 illustrates one or more stages of an example of a method for manufacturing a semiconductor package structure according to some embodiments of the present disclosure.

Referring to FIG. 17, the conductive material 17 is patterned to form a circuit layer on the encapsulant. In some embodiments, the conductive material 17 on the first surface 161 (e.g., a top surface) of the encapsulant 16 is patterned to form a redistribution layer 18. Thus, the circuit layer includes the redistribution layer 18 disposed on the encapsulant 16, a conductive via 22 in the first hole 5, and the periphery via 21' in the second hole 4'. Meanwhile, the lower structure 19 includes a first end 191 and a second end 192. The first end 191 is disposed on the first surface 161 of the encapsulant 16, and the second end 192 is disposed on the inner lateral surface 164 and the inner bottom surface 165 of the encapsulant 16. In addition, the conductive via 22 electrically connects the active surface 31 of semiconductor chip 3 and the redistribution layer 18.

Figure 18:
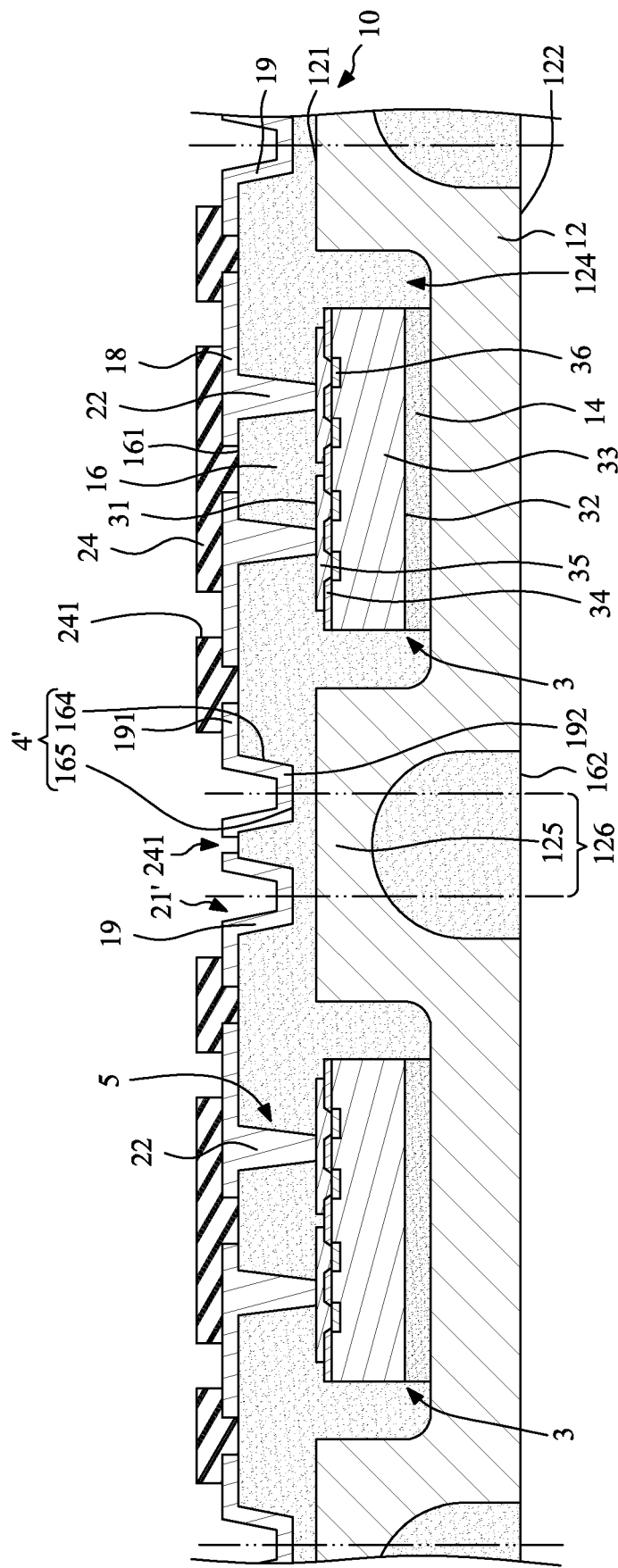
FIG. 18 illustrates one or more stages of an example of a method for manufacturing a semiconductor package structure according to some embodiments of the present disclosure.

Referring to FIG. 18, a first protection layer 24 is formed or disposed on the first surface 161 of the encapsulant 16 and covers the redistribution layer 18. The first protection layer 24 defines a plurality of openings 241 to expose portions (e.g., the bonding pads) of the redistribution layer 18 and the periphery via 21' (including the lower structure 19). The first protection layer 24 may include a solder resist material, such as, for example, epoxy acrylate, benzocyclobutene (BCB) or polyimide.

Figure 19:
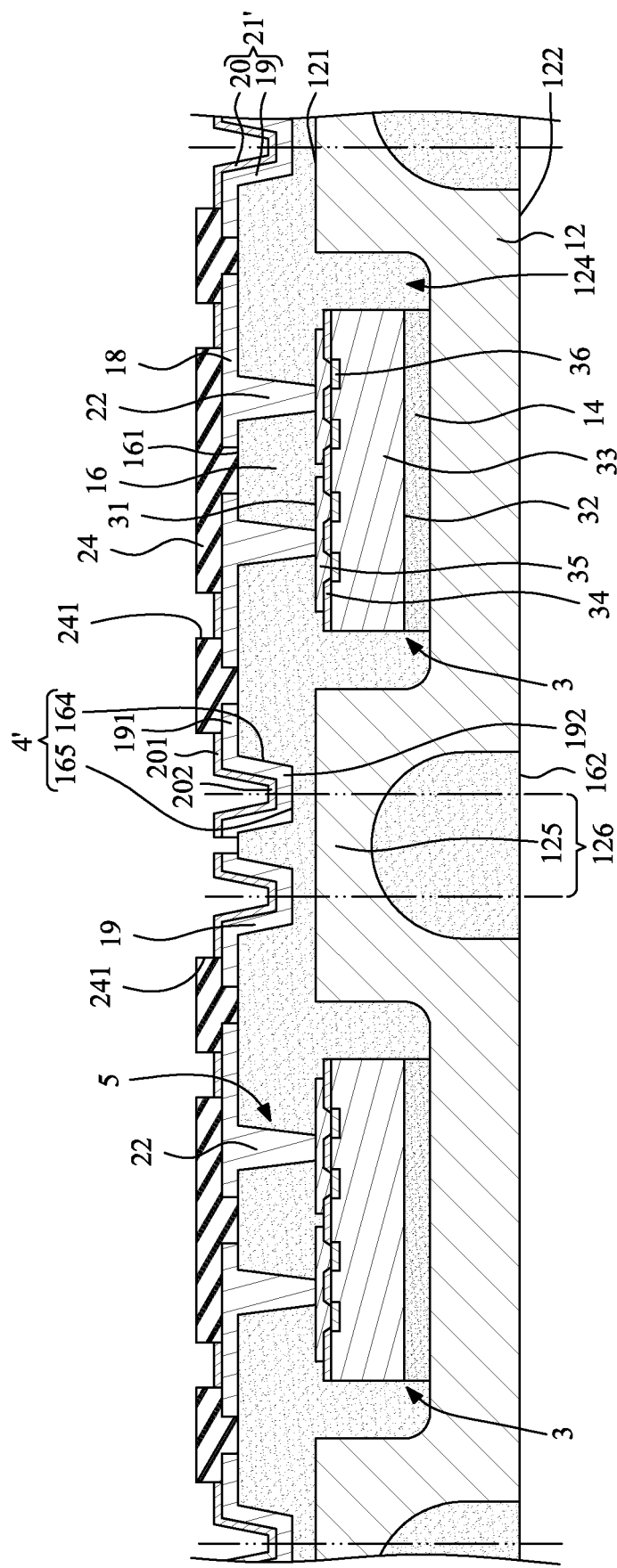
FIG. 19 illustrates one or more stages of an example of a method for manufacturing a semiconductor package structure according to some embodiments of the present disclosure.

Referring to FIG. 19, a wetting layer 20 is formed. The wetting layer 20 is a solder wetting layer. For example, the wetting layer 20 may an electroless nickel immersion gold (ENIG) layer. A portion of the wetting layer 20 is disposed in the openings 241 on the exposed portions (e.g., the bonding pads) of the redistribution layer 18. The other portion of the wetting layer 20 is formed or disposed in the central hole of the periphery via 21', and does not fill the central hole defined by the lower structure 19 of the periphery via 21'. Meanwhile, the periphery via 21' includes the lower structure 19 and the wetting layer 20. The wetting layer 20 includes a first end 201 and a second end 202. The first end 201 is disposed on the first end 191 of the lower structure 19, and the second end 202 is disposed on the second end 192 of the lower structure 19.

Then, a singulation process is conducted along the predetermined saw street 126 to form a plurality of semiconductor package structures 1 of FIG. 1. Meanwhile, a first portion of the periphery via 21' is removed, and a second portion of the periphery via 21' remains in the semiconductor package structure 1 to form a depression structure 21. In addition, the second hole 4' becomes an indentation structure 4.

Figure 20:
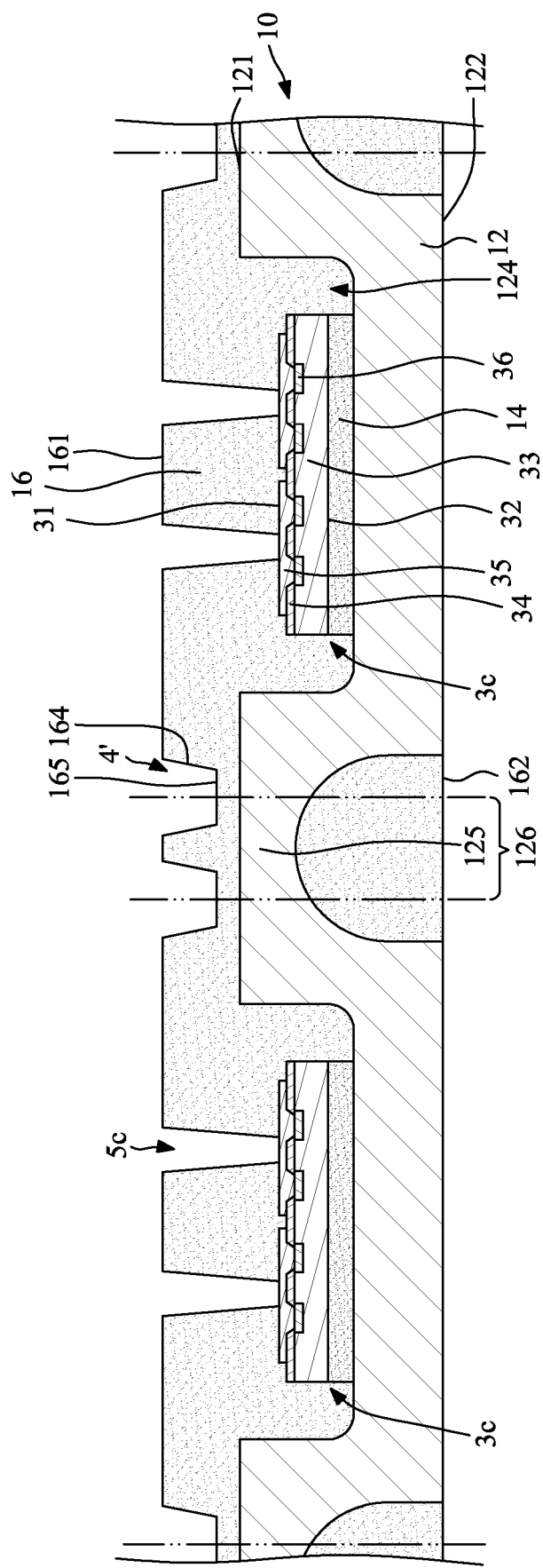
FIG. 20 illustrates one or more stages of an example of a method for manufacturing a semiconductor package structure according to some embodiments of the present disclosure.

FIG. 20 illustrates a method for manufacturing a semiconductor package structure according to some embodiments of the present disclosure. In some embodiments, the method is for manufacturing a semiconductor package structure such as the semiconductor package structure 1c shown in FIG. 7. The initial stages of the illustrated process are the same as, or similar to, the stages illustrated in FIGS. 12 to 14. FIG. 20 depicts a stage subsequent to that depicted in FIG. 14.

Referring to FIG. 20, at least one first hole 5c and at least one second hole 4' are formed in the encapsulant 16, and are recessed from the first surface 161 (e.g., a top surface) of the encapsulant 16. As shown in FIG. 20, a thickness of the semiconductor chip 3c is less than a thickness of the semiconductor chip 3 of FIG. 1, and the first surface 31 of the semiconductor chip 3c is lower than the first surface 121 of the base material 12. Thus, a depth of the first hole 5c of FIG. 20 is greater than the first depth $D_1$ of the first hole 5 of FIG. 1. In addition, a capacity volume of the first hole 5c is less than or equal a capacity volume of the second hole 4'. Then, the stages subsequent to that shown in FIG. 20 of the illustrated process are similar to the stages illustrated in FIGS. 16 to 19, thus forming the semiconductor package structure 1c shown in FIG. 7.

Figure 21:
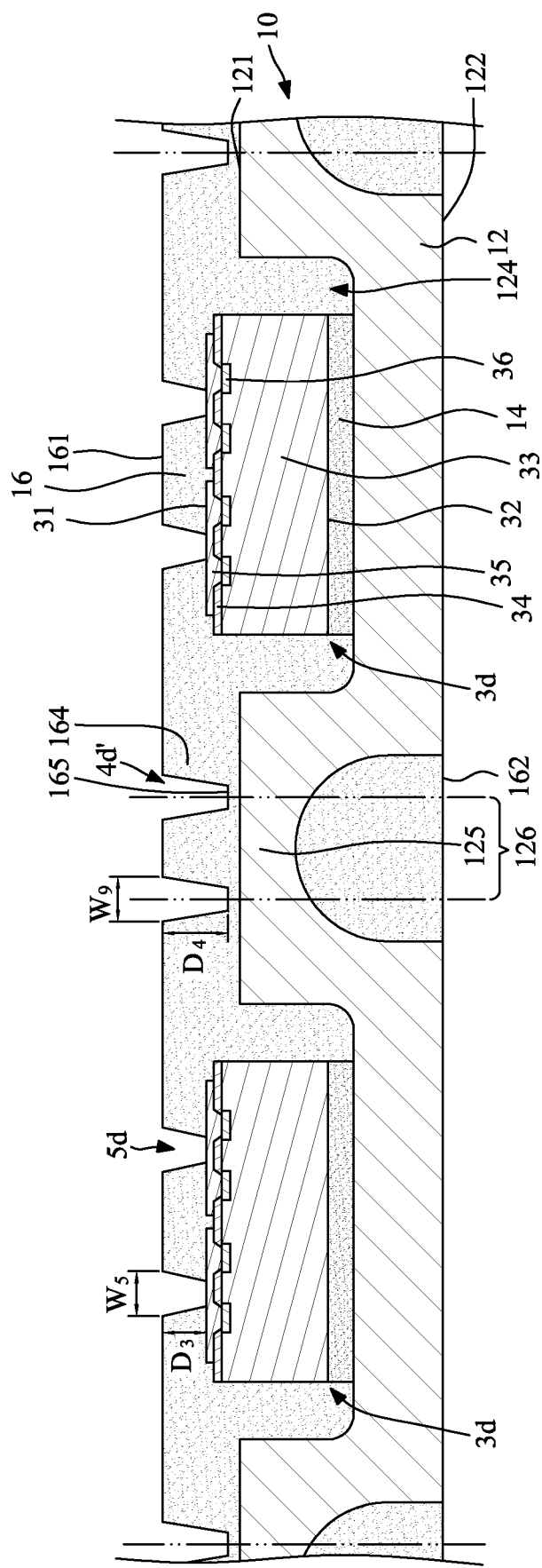
FIG. 21 illustrates one or more stages of an example of a method for manufacturing a semiconductor package structure according to some embodiments of the present disclosure.

FIG. 21 illustrates a method for manufacturing a semiconductor package structure according to some embodiments of the present disclosure. In some embodiments, the method is for manufacturing a semiconductor package structure such as the semiconductor package structure 1d shown in FIG. 8. The initial stages of the illustrated process are the same as, or similar to, the stages illustrated in FIGS. 12 to 14. FIG. 21 depicts a stage subsequent to that depicted in FIG. 14.

Referring to FIG. 21, at least one first hole 5d and at least one second hole 4d' are formed in the encapsulant 16, and are recessed from the first surface 161 (e.g., a top surface) of the encapsulant 16. As shown in FIG. 21, a thickness of the semiconductor chip 3d is greater than a thickness of the semiconductor chip 3 of FIG. 1, and the first surface 31 of the semiconductor chip 3d is higher than the first surface 121 of the base material 12. Thus, a first depth $D_3$ of the first hole 5d of FIG. 21 is less than the first depth $D_1$ of the first hole 5 of FIG. 1. Further, the first depth $D_3$ of the first hole 5d is less than a second depth $D_4$ of the second hole 4d', and the fifth width $W_5$ of the first portion (e.g., top portion) of the first hole 5d is substantially equal to the ninth width $W_9$ of the first portion (e.g., top portion) of the second hole 4d'. Thus, a capacity volume of the first hole 5d is less than a capacity volume of the second hole 4d'. Then, the stages subsequent to that shown in FIG. 21 of the illustrated process are similar to the stages illustrated in FIGS. 16 to 19, thus forming the semiconductor package structure 1d shown in FIG. 8.

Figure 22:
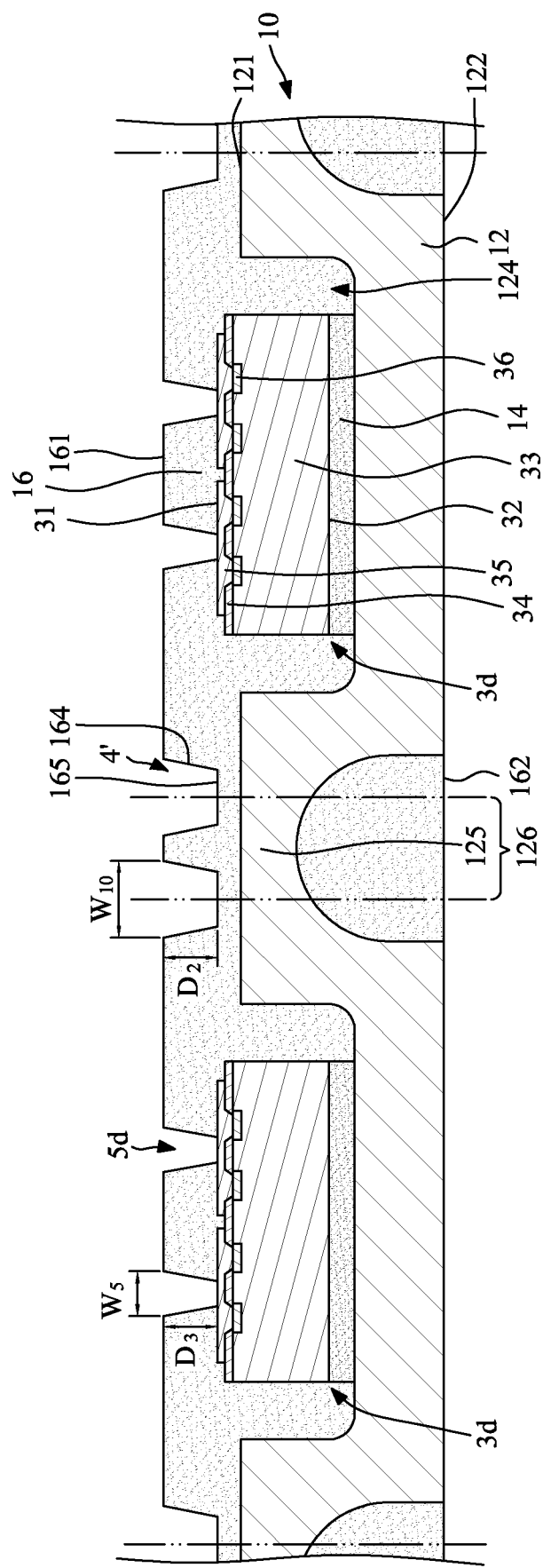
FIG. 22 illustrates one or more stages of an example of a method for manufacturing a semiconductor package structure according to some embodiments of the present disclosure.

FIG. 22 illustrates a method for manufacturing a semiconductor package structure according to some embodiments of the present disclosure. In some embodiments, the method is for manufacturing a semiconductor package structure such as the semiconductor package structure 1e shown in FIG. 9. The initial stages of the illustrated process are the same as, or similar to, the stages illustrated in FIGS. 12 to 14. FIG. 22 depicts a stage subsequent to that depicted in FIG. 14.

Referring to FIG. 22, at least one first hole 5d and at least one second hole 4' are formed in the encapsulant 16, and are recessed from the first surface 161 (e.g., a top surface) of the encapsulant 16. As shown in FIG. 22, a thickness of the semiconductor chip 3d is greater than a thickness of the semiconductor chip 3 of FIG. 1, and the first surface 31 of the semiconductor chip 3d is higher than the first surface 121 of the base material 12. Thus, a first depth $D_3$ of the first hole 5d of FIG. 22 is less than the first depth $D_1$ of the first hole 5 of FIG. 1. Further, the first depth $D_3$ of the first hole 5d is substantially equal to a second depth $D_2$ of the second hole 4', and the fifth width $W_5$ of the first portion (e.g., top portion) of the first hole 5d is less than the tenth width $W_{10}$ of the first portion (e.g., top portion) of the second hole 4'. In some embodiments, the tenth width $W_{10}$ of the first portion (e.g., top portion) of the second hole 4' of FIG. 22 may be equal to the seventh width $W_7$ of the first portion 41' of the second hole 4' of FIG. 15. Thus, a capacity volume of the first hole 5d is less than a capacity volume of the second hole 4'. Then, the stages subsequent to that shown in FIG. 22 of the illustrated process are similar to the stages illustrated in FIGS. 16 to 19, thus forming the semiconductor package structure 1e shown in FIG. 9.

Figure 23:
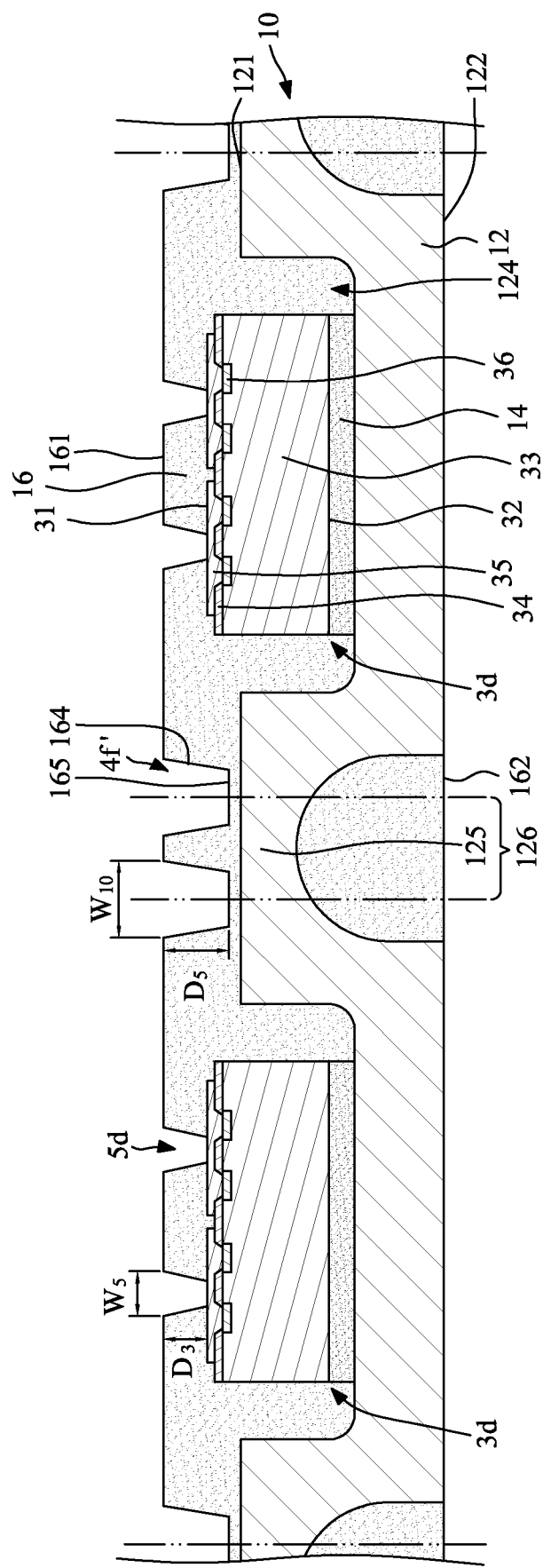
FIG. 23 illustrates one or more stages of an example of a method for manufacturing a semiconductor package structure according to some embodiments of the present disclosure.

FIG. 23 illustrates a method for manufacturing a semiconductor package structure according to some embodiments of the present disclosure. In some embodiments, the method is for manufacturing a semiconductor package structure such as the semiconductor package structure if shown in FIG. 10. The initial stages of the illustrated process are the same as, or similar to, the stages illustrated in FIGS. 12 to 14. FIG. 23 depicts a stage subsequent to that depicted in FIG. 14.

Referring to FIG. 23, at least one first hole 5d and at least one second hole 4f are formed in the encapsulant 16, and are recessed from the first surface 161 (e.g., a top surface) of the encapsulant 16. As shown in FIG. 23, a thickness of the semiconductor chip 3d is greater than a thickness of the semiconductor chip 3 of FIG. 1, and the first surface 31 of the semiconductor chip 3d is higher than the first surface 121 of the base material 12. Thus, a first depth $D_3$ of the first hole 5d of FIG. 23 is less than the first depth $D_1$ of the first hole 5 of FIG. 1. Further, the first depth $D_3$ of the first hole 5d is less than a second depth $D_5$ of the second hole 4f, and the fifth width $W_5$ of the first portion (e.g., top portion) of the first hole 5d is less than the tenth width $W_{10}$ of the first portion (e.g., top portion) of the second hole 4f. In some embodiments, the tenth width $W_{10}$ of the first portion (e.g., top portion) of the second hole 4f of FIG. 23 may be equal to the seventh width $W_7$ of the first portion 41' of the second hole 4' of FIG. 15. Thus, a capacity volume of the first hole 5d is less than a capacity volume of the second hole 4f. Then, the stages subsequent to that shown in FIG. 23 of the illustrated process are similar to the stages illustrated in FIGS. 16 to 19, thus forming the semiconductor package structure if shown in FIG. 10.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a base material;
   at least one semiconductor chip disposed on the base material;
   an encapsulant disposed on the base material and covering the at least one semiconductor chip;

a redistribution layer disposed on the encapsulant and having an outer side surface;
a wetting layer disposed on the outer side surface of the redistribution layer; and
at least one conductive via disposed in the encapsulant and electrically connecting the at least one semiconductor chip and the redistribution layer,
wherein the outer side surface of the redistribution layer is substantially coplanar with an outer side surface of the encapsulant.

2. The semiconductor package structure of claim 1, wherein the base material is a lead frame or an organic substrate.

3. The semiconductor package structure of claim 1, wherein the base material defines a cavity, and the at least one semiconductor chip is disposed in the cavity.

4. The semiconductor package structure of claim 1, wherein the at least one semiconductor chip has an active surface and a backside surface opposite to the active surface, the backside surface of the at least one semiconductor chip is attached to the base material, the active surface of the at least one semiconductor chip faces the redistribution layer, and the at least one conductive via is electrically connected to the active surface of the at least one semiconductor chip.

5. The semiconductor package structure of claim 1, wherein the wetting layer is a solder wetting layer.

6. The semiconductor package structure of claim 1, wherein the wetting layer is an electroless nickel immersion gold (ENIG) layer.

7. A semiconductor package structure, comprising:
a base material;
at least one semiconductor chip disposed on the base material;
an encapsulant disposed on the base material and covering the at least one semiconductor chip, wherein the encapsulant has an outer side surface;
a depression structure disposed adjacent to and exposed from the outer side surface the encapsulant;
a redistribution layer disposed on the encapsulant; and
at least one conductive via disposed in the encapsulant and electrically connecting the at least one semiconductor chip and the redistribution layer,
wherein the encapsulant further has a top surface, and a portion of the depression structure is disposed on the top surface of the encapsulant.

8. The semiconductor package structure of claim 7, wherein the depression structure includes a lower structure and a wetting layer disposed on the lower structure.

9. The semiconductor package structure of claim 8, wherein the lower structure of the depression structure and the redistribution layer are the same layer.

10. The semiconductor package structure of claim 8, wherein the wetting layer is an electroless nickel immersion gold (ENIG) layer.

11. The semiconductor package structure of claim 7, wherein the encapsulant defines at least one first hole for accommodating the at least one conductive via, and an indentation structure for accommodating the depression structure, wherein a radius of curvature of a top portion of the indentation structure of the encapsulant is greater than or equal to a radius of curvature of a top portion of the first hole of the encapsulant.

12. The semiconductor package structure of claim 7, wherein the the depression structure has a bottom end, the conductive via has a bottom end, a distance between the top surface of the encapsulant and the bottom end of the depression structure is less than a distance between the top surface of the encapsulant and the bottom end of the conductive via.

13. The semiconductor package structure of claim 7, wherein the encapsulant further has a top surface and a corner portion defined by the top surface and the outer side surface, and the depression structure is disposed at the corner portion.

14. The semiconductor package structure of claim 7, further comprising a protection layer disposed on the top surface of the encapsulant and covering the redistribution layer, wherein the protection layer defines a plurality of openings to expose portions of the redistribution layer and the depression structure.

15. The semiconductor package structure of claim 14, further including a wetting layer disposed in one of the plurality openings on the exposed portions of the redistribution layer.

16. The semiconductor package structure of claim 8, wherein an outer side surface of the lower structure is substantially coplanar with an outer side surface of the wetting layer.

17. The semiconductor package structure of claim 8, wherein an inner lateral surface of the lower structure is not coplanar with an inner lateral surface of the wetting layer.

18. The semiconductor package structure of claim 11, wherein the indentation structure further includes a bottom portion, and a width of the top portion is greater than a width of the bottom portion.

19. The semiconductor package structure of claim 7, wherein the depression structure defines a recess portion recessed from the outer side surface of the encapsulant.

20. A semiconductor package structure, comprising:
a base material;
at least one semiconductor chip disposed on the base material;
an encapsulant disposed on the base material and covering the at least one semiconductor chip, wherein the encapsulant has an outer side surface;
a depression structure disposed adjacent to and exposed from of the outer side surface the encapsulant;
a redistribution layer disposed on the encapsulant; and
at least one conductive via disposed in the encapsulant and electrically connecting the at least one semiconductor chip and the redistribution layer, wherein the depression structure is a solder wetting structure.

* * * * *